US011882725B2

(12) United States Patent
Cho et al.

(10) Patent No.: US 11,882,725 B2
(45) Date of Patent: Jan. 23, 2024

(54) DISPLAY APPARATUS

(71) Applicant: SAMSUNG DISPLAY CO., LTD., Yongin-si (KR)

(72) Inventors: Junghyun Cho, Yongin-si (KR); Gunwoo Ko, Yongin-si (KR); Chiwook An, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 244 days.

(21) Appl. No.: 17/459,699

(22) Filed: Aug. 27, 2021

(65) Prior Publication Data

US 2022/0173361 A1 Jun. 2, 2022

(30) Foreign Application Priority Data

Dec. 1, 2020 (KR) .................. 10-2020-0165945

(51) Int. Cl.
| | | |
|---|---|---|
| *G06F 3/041* | (2006.01) | |
| *H10K 59/40* | (2023.01) | |
| *H10K 50/86* | (2023.01) | |
| *H10K 50/858* | (2023.01) | |
| *H10K 59/38* | (2023.01) | |
| *H10K 59/122* | (2023.01) | |

(52) U.S. Cl.
CPC ......... *H10K 50/858* (2023.02); *G06F 3/0412* (2013.01); *H10K 59/40* (2023.02); *H10K 50/865* (2023.02); *H10K 59/122* (2023.02); *H10K 59/38* (2023.02)

(58) Field of Classification Search
CPC .... H10K 50/865; H10K 59/40; H10K 59/122; H10K 59/30; G06F 3/0412; G06F 3/0445; G06F 3/0446
See application file for complete search history.

(56) References Cited

U.S. PATENT DOCUMENTS

| | | |
|---|---|---|
| 7,985,476 B2 | 7/2011 | Kurino et al. |
| 8,008,855 B2 | 8/2011 | Song et al. |
| 8,410,477 B2 | 4/2013 | Lee et al. |
| 8,687,273 B2 | 4/2014 | Fukushima et al. |
| 9,257,677 B2 | 2/2016 | Park et al. |
| 9,318,726 B2 | 4/2016 | Choi et al. |

(Continued)

FOREIGN PATENT DOCUMENTS

| | | |
|---|---|---|
| CN | 110323353 A | 10/2019 |
| JP | 2000322000 A | 11/2000 |

(Continued)

*Primary Examiner* — Angela K Davison
(74) *Attorney, Agent, or Firm* — CANTOR COLBURN LLP

(57) ABSTRACT

A display apparatus includes: a first electrode; a bank layer defining a first opening which overlaps the first electrode in a plan view; an emission layer which overlaps the first electrode through the first opening; a second electrode on the emission layer; an encapsulation layer on the second electrode; a first insulating layer on the encapsulation layer, where the first insulating layer includes a first portion overlapping the first opening and defines a trench surrounding the first portion; a touch electrode on the first insulating layer; a second insulating layer on the touch electrode and defining a second opening which overlaps the first opening; and a third insulating layer on the second insulating layer.

14 Claims, 16 Drawing Sheets

(56) References Cited

U.S. PATENT DOCUMENTS

| | | | |
|---|---|---|---|
| 9,356,079 B2 | 5/2016 | Choi et al. | |
| 9,368,757 B2 | 6/2016 | Choi et al. | |
| 9,406,724 B2 | 8/2016 | Choi et al. | |
| 9,478,771 B2 | 10/2016 | Song et al. | |
| 9,818,966 B2 | 11/2017 | Noh | |
| 10,033,014 B2 | 7/2018 | Chen et al. | |
| 10,050,236 B2 | 8/2018 | Chen et al. | |
| 10,199,608 B2 | 2/2019 | Woo et al. | |
| 10,224,377 B2 | 3/2019 | Park et al. | |
| 10,388,913 B2 | 8/2019 | Jung et al. | |
| 10,418,587 B2 | 9/2019 | Kim et al. | |
| 10,707,447 B2 | 7/2020 | Kim et al. | |
| 10,971,702 B2 | 4/2021 | Kim et al. | |
| 2011/0140151 A1 | 6/2011 | Lee et al. | |
| 2016/0087245 A1 | 3/2016 | Park et al. | |
| 2018/0011385 A1* | 1/2018 | Kang | H10K 59/126 |
| 2019/0115404 A1 | 4/2019 | Moon et al. | |
| 2019/0165061 A1* | 5/2019 | Jung | H10K 50/858 |
| 2019/0265390 A1 | 8/2019 | Lim | |
| 2020/0161395 A1 | 5/2020 | Kim et al. | |

FOREIGN PATENT DOCUMENTS

| | | | |
|---|---|---|---|
| JP | 200439500 | A | 2/2004 |
| JP | 4933553 | B2 | 5/2012 |
| KR | 1020100030982 | A | 3/2010 |
| KR | 101074804 | B1 | 10/2011 |
| KR | 101084178 | B1 | 11/2011 |
| KR | 101248904 | B1 | 3/2013 |
| KR | 1020140143916 | A | 12/2014 |
| KR | 1020150017969 | A | 2/2015 |
| KR | 1020150145834 | A | 12/2015 |
| KR | 1020160017397 | A | 2/2016 |
| KR | 1020160027608 | A | 3/2016 |
| KR | 1020160034457 | A | 3/2016 |
| KR | 1020170051676 | A | 5/2017 |
| KR | 1020180005323 | A | 1/2018 |
| KR | 1020180125674 | A | 11/2018 |
| KR | 1020180133992 | A | 12/2018 |
| KR | 1020190004863 | A | 1/2019 |
| KR | 1020190041558 | A | 4/2019 |
| KR | 1020190062678 | A | 6/2019 |
| KR | 1020190087689 | A | 7/2019 |
| KR | 1020190103551 | A | 9/2019 |
| KR | 102028025 | B1 | 10/2019 |
| KR | 1020200058643 | A | 5/2020 |
| KR | 1020200081627 | A | 7/2020 |

* cited by examiner

DISPLAY APPARATUS

This application claims priority to Korean Patent Application No. 10-2020-0165945, filed on Dec. 1, 2020, and all the benefits accruing therefrom under 35 U.S.C. § 119, the content of which in its entirety is herein incorporated by reference.

BACKGROUND

1. Field

One or more embodiments relate to a display apparatus.

2. Description of the Related Art

As a field of displays that visually expresses various pieces of electric signal information rapidly develops, various display apparatuses have been introduced with excellent characteristics such as being thinner and more lightweight and having low power consumption.

The display apparatus may include a liquid crystal display apparatus that does not emit light and uses light from a backlight unit or a light-emitting display apparatus including a display element that may emit light. The light-emitting display apparatus may include display elements including an emission layer.

SUMMARY

One or more embodiments include a display apparatus, and more particularly, to a structure of a light-emitting display apparatus.

Additional aspects will be set forth in part in the description which follows and, in part, will be apparent from the description, or may be learned by practice of the presented embodiments of the disclosure.

According to one or more embodiments, a display apparatus includes: a first electrode; a bank layer defining a first opening which overlaps the first electrode in a plan view; an emission layer which overlaps the first electrode through the first opening; a second electrode on the emission layer; an encapsulation layer on the second electrode; a first insulating layer on the encapsulation layer, where the first insulating layer includes a first portion overlapping the first opening and defines a main trench surrounding the first portion; a touch electrode on the first insulating layer; a second insulating layer on the touch electrode and defining a second opening which overlaps the first opening; and a third insulating layer on the second insulating layer.

A first refractive index of the first insulating layer may be greater than each of a second refractive index of the second insulating layer and a third refractive index of the third insulating layer.

The third refractive index of the third insulating layer may be greater than the second refractive index of the second insulating layer.

The first insulating layer may include a multi-layered structure including a first sub-insulating layer and a second sub-insulating layer.

The touch electrode may include a metal line surrounding at least a portion of the first opening in the plan view, and the metal line may be disposed on at least one of the first sub-insulating layer or the second sub-insulating layer.

A lateral surface of the first portion may include a forward-tapered slope.

The slope of the lateral surface of the first portion may be about 40 degrees (°) to about 80°.

The first insulating layer may include an inorganic insulating material.

A width of the second opening of the second insulating layer may be equal to or greater than a width of the first opening of the bank layer.

A width of the first portion of the first insulating layer may be equal to or greater than the width of the first opening.

A width of the first portion of the first insulating layer may be equal to or less than the width of the first opening.

An edge of the second insulating layer that defines the second opening may be arranged on the first portion.

An edge of the second insulating layer that defines the second opening may be arranged in the main trench.

The first portion of the first insulating layer may include a first sub-portion and a second sub-portion which are apart from each other with respect to a sub-trench surrounded by the main trench.

The display apparatus may further include a filter layer arranged between the first insulating layer and the second insulating layer and including a light-blocking portion and a color filter.

According to one or more embodiments, a display apparatus includes: a light-emitting diode including a first electrode, a second electrode, and an emission layer between the first electrode and the second electrode; a bank layer overlapping the first electrode of the light-emitting diode in a plan view and defining a first opening which defines an emission area of the light-emitting diode; a first insulating layer on the light-emitting diode and having a first refractive index, wherein the first insulating layer includes a first portion overlapping the first opening and a second portion which is apart from the first portion with a main trench therebetween; a second insulating layer on the first insulating layer, having a second refractive index different from the first refractive index, and defining a second opening which overlaps the first opening in the plan view; and a third insulating layer on the second insulating layer and having a third refractive index different from the second refractive index.

The trench of the first insulating layer may have a closed-loop shape in the plan view.

The first refractive index may be greater than the second refractive index.

The third refractive index may be greater than the second refractive index.

A lateral surface of the first portion may include a forward-tapered slope.

The first insulating layer may include an inorganic insulating material.

The display apparatus may further include an encapsulation layer on the light-emitting diode, and a touch electrode on the encapsulation layer, where the touch electrode may be interposed between the first insulating layer and the second insulating layer.

The first insulating layer may have a multi-layered structure including a first sub-insulating layer and a second sub-insulating layer, the touch electrode may include a metal line surrounding at least a portion of the first opening in the plan view, and the metal line may be disposed on at least one of the first sub-insulating layer or the second sub-insulating layer.

A width of the second opening of the second insulating layer may be equal to or greater than a width of the first opening of the bank layer.

A width of the first portion of the first insulating layer may be equal to or greater than the width of the first opening.

A width of the first portion of the first insulating layer may be equal to or less than the width of the first opening.

A width of the second opening of the second insulating layer may be less than a width of the first portion of the first insulating layer, and a lateral surface of the first portion of the first insulating layer may be covered by the second insulating layer.

A width of the second opening of the second insulating layer may be greater than a width of the first portion of the first insulating layer, and a lateral surface of the first portion of the first insulating layer may be covered by the third insulating layer.

The first portion of the first insulating layer may include a first sub-portion and a second sub-portion which are apart from each other with respect to a sub-trench surrounded by the main trench.

A lateral surface of the first sub-portion may be covered by the third insulating layer, and a lateral surface of the second sub-portion may be covered by the second insulating layer.

The display apparatus may further include a filter layer arranged between the first insulating layer and the second insulating layer and including a light-blocking portion and a color filter.

These and/or other aspects will become apparent and more readily appreciated from the following description of the embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
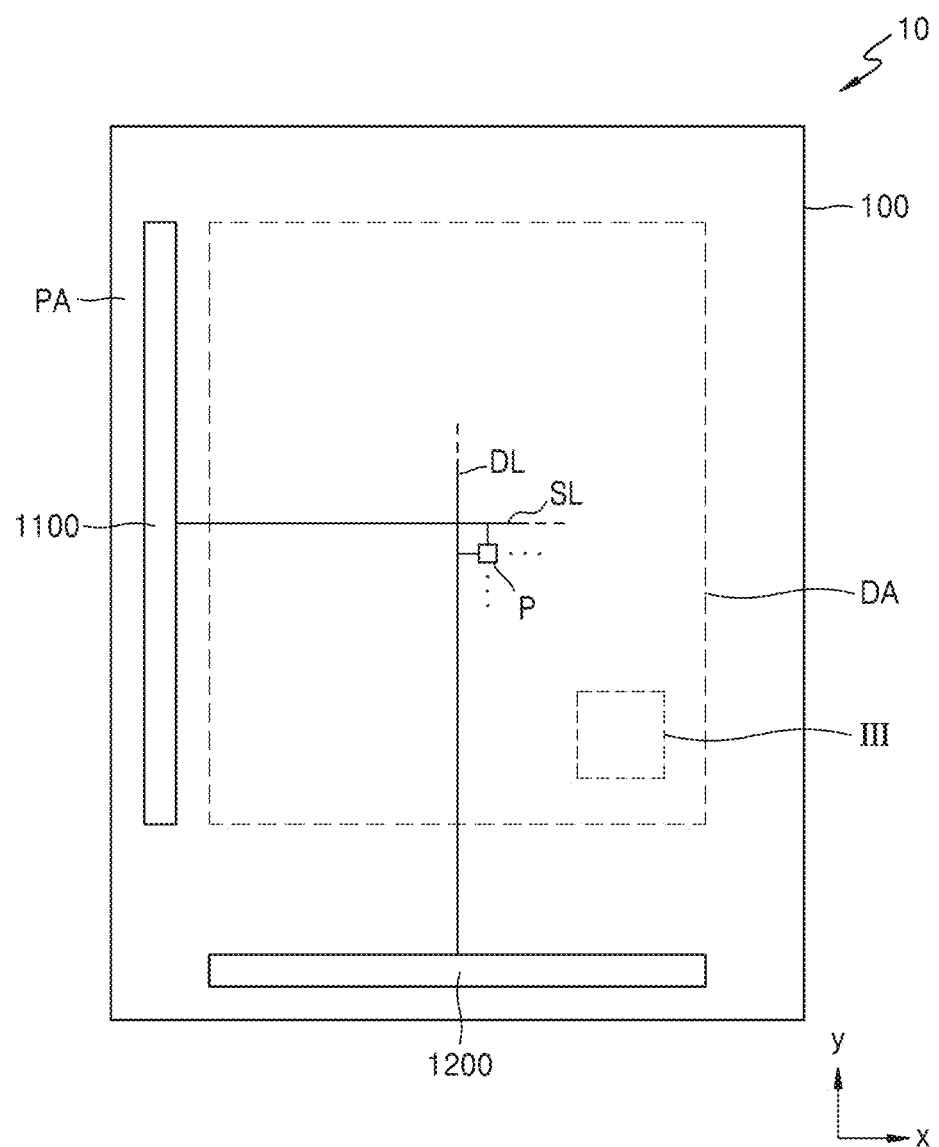
FIG. 1 is a plan view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

When an embodiment may be implemented differently, a certain process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

In the following examples, the x-axis, the y-axis and the z-axis are not limited to three axes of the rectangular coordinate system, and may be interpreted in a broader sense. For example, the x-axis, the y-axis and the z-axis may be perpendicular to one another, or may represent different directions that are not perpendicular to one another.

FIG. 1 is a plan view of a display apparatus 10 according to an embodiment.

The display apparatus 10 may include a display area DA and a peripheral area PA adjacent to the display area DA. The display apparatus 10 includes a plurality of pixels P arranged in the display area DA. Each pixel P may be connected to a scan line SL and a data line DL. FIG. 1 may be understood as a figure of a substrate 100 of the display apparatus 10. As an example, it may be understood that the substrate 100 includes the display area DA and the peripheral area PA.

A scan driver 1100, a data driver 1200, and a main power wiring (not shown) may be arranged in the peripheral area PA. The scan driver 1100 provides a scan signal to each pixel P through the scan line SL, the data driver 1200 provides a data signal to each pixel P through the data line DL, and the main power wiring provides first and second power voltages ELVDD and ELVSS (FIG. 2).

Though it is shown in FIG. 1 that the data driver 1200 is arranged on the substrate 100, the data driver 1200 may be arranged on a flexible printed circuit board ("FPCB") electrically connected to a pad on one side of the display apparatus 10 in another embodiment.

Figure 2:
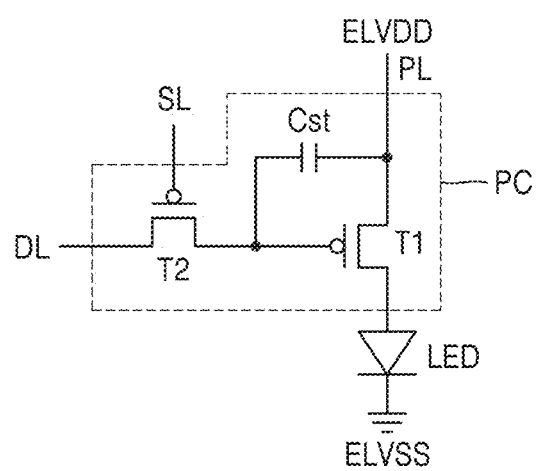
FIG. 2 is an equivalent circuit diagram of a light-emitting diode and a pixel circuit electrically connected to the light-emitting diode, which correspond to a pixel of the display apparatus according to an embodiment.

FIG. 2 is an equivalent circuit diagram of a light-emitting diode LED and a pixel circuit PC electrically connected to the light-emitting diode LED. The equivalent circuit diagram in FIG. 2 corresponds to a pixel of the display apparatus 10 according to an embodiment.

Referring to FIG. 2, the pixel circuit PC may include a first thin-film transistor T1, a second thin-film transistor T2, and a storage capacitor Cst. The display apparatus 10 of FIG. 1 may provide an image by using light emitted from a light-emitting diode LED corresponding to each pixel P.

The second thin-film transistor T2 may be a switching thin-film transistor, may be connected to the scan line SL and the data line DL, and may be configured to transfer a data voltage to the first thin-film transistor T1 according to a switching voltage input from the scan line SL, the data voltage being input from the data line DL. The storage capacitor Cst may be connected to the second thin-film transistor T2 and a driving voltage line PL, and may store a voltage corresponding to a difference between a voltage transferred from the second thin-film transistor T2 and the first power voltage ELVDD supplied to the driving voltage line PL.

The first thin-film transistor T1 may be a driving thin-film transistor, may be connected to the driving voltage line PL and the storage capacitor Cst, and may be configured to control a driving current flowing to the light-emitting diode LED from the driving voltage line PL according to the voltage stored in the storage capacitor Cst. The light-emitting diode LED may emit light having preset brightness according to the driving current. A second electrode (e.g., a cathode) of the light-emitting diode LED may be supplied with the second power voltage ELVSS.

Though it is shown in FIG. 2 that the pixel circuit PC includes two thin-film transistors and one storage capacitor, the embodiment according to the invention is not limited thereto. The number of thin-film transistors and the number of storage capacitors may be variously changed depending on the design of the pixel circuit PC.

The light-emitting diode LED may include an organic light-emitting diode including an organic material. In another embodiment, the light-emitting diode LED may be an inorganic light-emitting diode including an inorganic material. An inorganic light-emitting diode may include a PN-junction diode including inorganic semiconductor-based materials. When a voltage is applied to the PN-junction diode in a forward direction, holes and electrons are injected, and light of a preset color may be emitted by converting energy generated by recombination of holes and electrons into light energy. The inorganic light-emitting diode may have a width of several micrometers to hundreds of micrometers or several nanometers to hundreds of nanometers. In an embodiment, the light-emitting diode LED may be a light-emitting diode including quantum dots. As described above, the light-emitting diode LED may include an organic material, an inorganic material, quantum dots, an organic material and quantum dots, or an inorganic material and quantum dots. For convenience of description, description is made to the case where the light-emitting diode LED includes an organic light-emitting diode.

Figure 3:
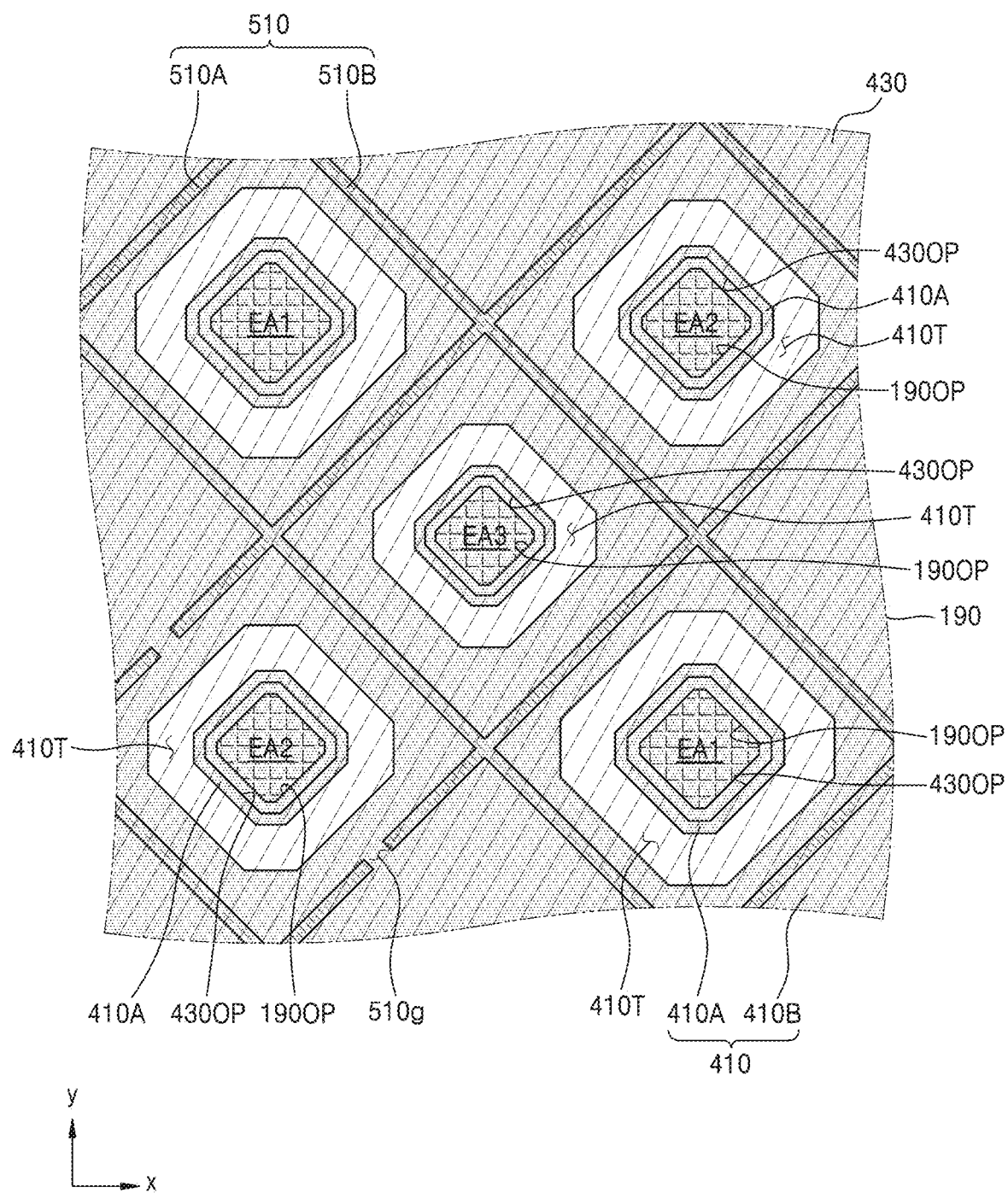
FIG. 3 is a plan view of a region III of FIG. 1.

FIG. 3 is a plan view of a region III of FIG. 1.

Referring to FIG. 3, first to third emission areas EA1, EA2, and EA3 may be arranged in the display area DA (see FIG. 1) of the display apparatus 10. The first to third emission areas EA1, EA2, and EA3 may emit light that are different color each other. In an embodiment, the first to third emission areas EA1, EA2, and EA3 may emit red, green, or blue light. In an embodiment, red light may be emitted from the first emission area EA1, blue light may be emitted from the second emission area EA2, and green light may be emitted from the third emission area EA3. A pixel is an area from which light is emitted. The first to third emission areas EA1, EA2, and EA3 may correspond to pixels described above with reference to FIG. 1. As an example, the first emission area EA1 may correspond to a red pixel, the second emission area EA2 may correspond to a blue pixel, and the third emission area EA3 may correspond to a green pixel.

The first to third emission areas EA1, EA2, and EA3 may each be defined by a first opening 190OP of a bank layer 190 (or a bank insulating layer) of the display apparatus 10. As an example, the size (or the width) of the first opening 190OP of the bank layer 190 in a plan view may correspond to the size (or the width) of each of the first to third emission areas EA1, EA2, and EA3. In an embodiment, the first to third emission areas EA1, EA2, and EA3 may each correspond to the size (or the width) of each pixel.

The display apparatus 10 may include a touch electrode which may sense a touch input by a hand or a tool such as a stylus pen. As shown in FIG. 3, a touch electrode 510 may have a mesh structure in a plan view. As an example, the touch electrode 510 may have a mesh structure formed by first sub-lines 510A and second sub-lines 510B intersecting each other. The first sub-lines 510A extends in a first direction, and the second sub-lines 510B extends in a second direction that intersects with the first direction. Here, the first direction may be a first diagonal direction that is oblique with respect to an x-direction and a y-direction, and the second direction may be a second diagonal direction that is oblique with respect to the x-direction and the y-direction.

The first to third emission areas EA1, EA2, and EA3 may be at least partially surrounded by a line of the touch electrode 510, for example, the first and second sub-lines 510A and 510B. In an embodiment, it is shown in FIG. 3 that some of the first to third emission areas EA1, EA2, and EA3 may be entirely surrounded by the first and second sub-lines 510A and 510B of the touch electrode 510. The line of the touch electrode 510 may defines a gap 510g. In this case, other portions of the first to third emission areas EA1, EA2, and EA3 which is not adjacent to the gap 510g may be partially surrounded by the line of the touch electrode 510.

A first insulating layer 410 and a second insulating layer 430 may be arranged under and on the touch electrode 510, respectively. The first insulating layer 410 may define a trench 410T surrounding the first to third emission areas EA1, EA2, and EA3. The first insulating layer 410 may include a first portion 410A and a second portion 410B. The first portion 410A may be arranged inside the trench 410T, and the second portion 410B may be arranged outside the trench 410T in a plan view. The first portion 410A may overlap each of the first to third emission areas EA1, EA2, and EA3. The trench 410T is a kind of moat. The first portion 410A may be apart from the second portion 410B with the trench 410T therebetween. The first portion 410A may have an isolated shape.

The second insulating layer 430 may cover at least a portion of the trench 410T. In an embodiment, it is shown in FIG. 3 that the second insulating layer 430 covers the second portion 410B of the first insulating layer 410 and the trench 410T, and covers a part of the first portion 410A. The second insulating layer 430 may define a second opening 430OP that overlaps the first portion 410A of the first insulating layer 410 and each of the first to third emission areas EA1, EA2, and EA3 in a plan view.

Figure 4:
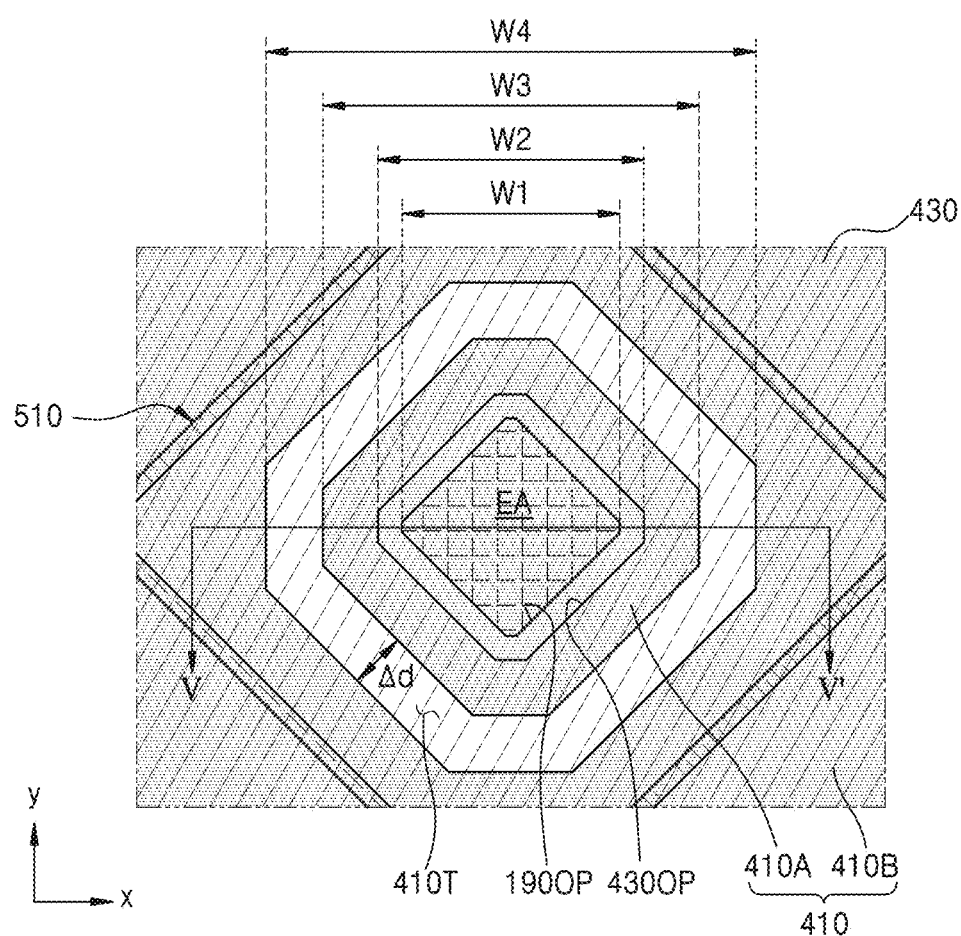
FIG. 4 is a plan view of a display apparatus according to an embodiment corresponding to a portion of FIG. 3.
Figure 5:
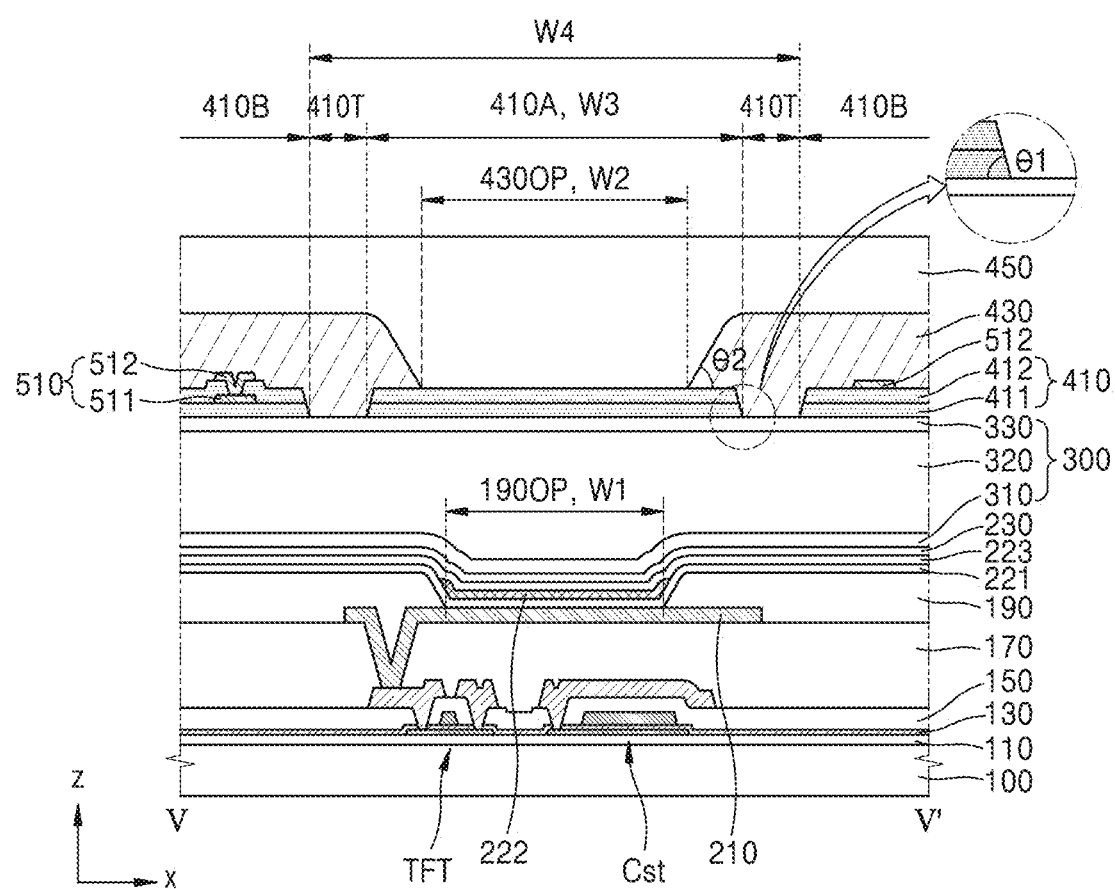
FIG. 5 is a cross-sectional view of the display apparatus according to an embodiment, taken along line V-V' of FIG. 4.
Figure 6:
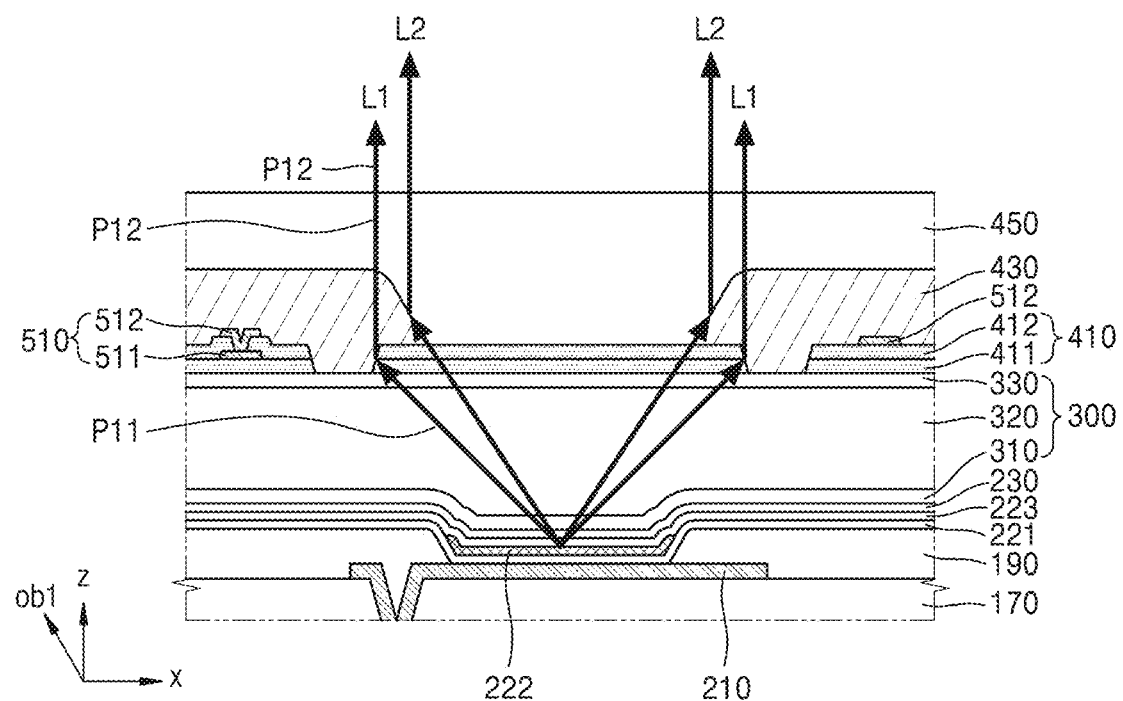
FIG. 6 is a view showing a progression path of light emitted from the display apparatus shown in FIG. 5.

FIG. 4 is a plan view of a display apparatus according to an embodiment corresponding to a portion of FIG. 3, FIG. 5 is a cross-sectional view of a display apparatus according to an embodiment, taken along line V-V' of FIG. 4, and FIG. 6 is a view showing a progression path of light emitted from the display apparatus shown in FIG. 5.

Referring to FIGS. 4 and 5, an encapsulation layer 300 may be disposed on the bank layer 190 defining the first opening 190OP. The first insulating layer 410, the second insulating layer 430, and a third insulating layer 450 may be disposed on the encapsulation layer 300.

The bank layer 190 defines the first opening 190OP therein. A first electrode 210 of the organic light-emitting diode OLED may be arranged below the first opening 190OP. A thin-film transistor TFT and the storage capacitor Cst over the substrate 100 may be arranged below the first electrode 210.

The substrate 100 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable.

A buffer layer 110, a gate insulating layer 130, an interlayer-insulating layer 150, and a planarization layer 170 may be disposed on the substrate 100. The buffer layer 110 prevents impurities from penetrating into a semiconductor layer of the thin-film transistor TFT, the gate insulating layer 130 insulates the semiconductor layer of the thin-film transistor TFT from a gate electrode, the interlayer-insulating layer 150 insulates source electrode/drain electrodes of the thin-film transistor TFT from the gate electrode, and the planarization layer 170 covers the thin-film transistor TFT and has an approximately flat top surface.

The first electrode 210 may be a reflective electrode including metal. The first electrode 210 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. The first electrode 210 may include a reflective layer and a transparent conductive layer on and/or under the reflective layer. The reflective layer includes the above material.

The bank layer 190 may cover the edge of the first electrode 210. The first opening 190OP of the bank layer 190 may overlap the first electrode 210 in a plan view. The bank layer 190 may include an organic insulating material. The organic insulating material may include, for example, an acryl-based resin, an epoxy-based resin, polyimide, and polyethylene.

An emission layer 222 may overlap the first electrode 210 through the first opening 190OP of the bank layer 190. The emission layer 222 may include a polymer resin or a low-molecular weight organic material.

A first functional layer 221 and a second functional layer 223 may be arranged under and on the emission layer 222, respectively. The first functional layer 221 may be arranged between the first electrode 210 and the emission layer 222. The second functional layer 223 may be arranged between the emission layer 222 and a second electrode 230. The first functional layer 221 may include a hole transport layer ("HTL") and/or a hole injection layer ("HIL"). The second functional layer 223 may include an electron transport layer ("ETL") and/or an electron injection layer ("EIL").

The second electrode 230 may include a semi-transmissive or transmissive electrode. The second electrode 230 may include a conductive material having a low work function. As an example, the second electrode 230 may include a layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the second electrode 230 may further include a layer including Indium tin oxide ("ITO"), indium zinc oxide ("IZO"), ZnO, or $In_2O_3$ on the layer including the above material.

The organic light-emitting diode may emit light having a preset color. the organic light-emitting diode includes the first electrode 210, the emission layer 222, and the second electrode 230. An area from which light is emitted, that is, an emission area EA (see FIG. 4) may be defined by the first opening 190OP of the bank layer 190. As an example, a width W1 of the first opening 190OP in a x-direction may correspond to the width of the emission area EA. The emission area EA of FIG. 4 may correspond to each of the first to third emission areas EA1, EA2, and EA3 described above with reference to FIG. 3.

The encapsulation layer 300 may include at least one inorganic encapsulation layer and at least one organic encapsulation layer. As an example, the encapsulation layer 300 may include a first inorganic encapsulation layer 310, a second inorganic encapsulation layer 330, and an organic encapsulation layer 320 therebetween.

The first insulating layer 410 may be arranged on the encapsulation layer 300. As shown in FIGS. 4 and 5, the first insulating layer 410 may include the first portion 410A, the trench 410T, and the second portion 410B. The first portion 410A overlaps the emission area EA in a plan view, the trench 410T surrounds the first portion 410A, and the second portion 410B surrounds the trench 410T.

As shown in FIG. 4, the trench 410T may have a closed-loop shape surrounding the entirety of the emission area EA, the first opening 190OP, and the first portion 410A in a plan view. The trench 410T is formed by removing a portion of the first insulating layer 410 in a z-direction which is a thickness direction. As shown in FIG. 5, the trench 410T may have a shape of a through-hole. The depth of the trench 410T may be substantially the same as the thickness of the first insulating layer 410. In another embodiment, the trench 410T may have a blind hole shape in which the depth of the trench 410T is less than the thickness of the first insulating layer 410 in the z-direction.

The first portion 410A and the second portion 410B may be apart from each other with the trench 410T therebetween. A distance Δd from the outer edge of the first portion 410A to the inner edge of the second portion 410B may correspond to the width of the trench 410T. The distance Δd may correspond to ½ times a difference between a width W4 of the inner edges of the second portion 410B and a width W3 of the first portion 410A.

Referring to the cross-section of the first portion 410A shown in FIG. 5, the first portion 410A may include a bottom surface, a top surface, and a lateral surface. The bottom surface faces the substrate 100, the top surface is an opposite side of the bottom surface, and the lateral surface connects the bottom surface to the top surface. The lateral surface of the first portion 410A may include a forward-tapered slope surface. The slope of the lateral surface of the first portion 410A may have a first angle θ1. The first angle θ1 may be an acute angle, for example, about 40 degrees (°) to about 80° with respect to the top surface of the second inorganic encapsulation layer 330.

The first portion 410A may overlap the emission layer EA (see FIG. 4) and/or the first opening 190OP of the bank layer 190 in a plan view. The width W3 of the first portion 410A may be greater than the width W1 of the first opening 190OP.

The first insulating layer 410 may include a plurality of sub-insulating layers. As an example, as shown in FIG. 5, the first insulating layer 410 may include a first sub-insulating layer 411 and a second sub-insulating layer 412. The first insulating layer 410 may include an inorganic insulating material. The first sub-insulating layer 411 and the second sub-insulating layer 412 may include silicon oxide, silicon nitride, and/or silicon oxynitride. The first sub-insulating layer 411 and the second sub-insulating layer 412 may include different inorganic insulating materials from each other, or include the same inorganic insulating material.

The first insulating layer 410 is a touch insulating layer. A touch electrode 510 may be arranged on the first insulating layer 410. In an embodiment, the touch electrode 510 may include a conductive line 512 arranged on the first insulating layer 410. The conductive line 512 may include the first and second sub-lines 510A and 510B having a mesh structure as described above with reference to FIG. 3. A portion of the conductive line 512 may be electrically connected to an auxiliary conductive line 511. The auxiliary conductive line 511 may correspond to a portion of a connection line electrically connecting neighboring touch electrodes 510.

Though it is shown in FIG. 5 that the conductive line 512 is arranged on the second sub-insulating layer 412, and the auxiliary conductive line 511 is arranged on the first sub-insulating layer 411, the embodiment according to the invention is not limited thereto. In another embodiment, the conductive line 512 may be arranged on the first sub-insulating layer 411, and the auxiliary conductive line 511 may be arranged on the second sub-insulating layer 412.

The second insulating layer 430 may be arranged on the touch electrode 510 and may protect the touch electrode 510. The second insulating layer 430 may define the second opening 430OP. The second opening 430OP may overlap the emission area EA, the first opening 190OP, and/or the first portion 410A of the first insulating layer 410 in a plan view. A width W2 of the second opening 430OP may be equal to or greater than the width W1 of the first opening 190OP. It is shown in FIGS. 4 and 5 that the width W2 of the second opening 430OP is greater than the width W1 of the first opening 190OP. The width W2 of the second opening 430OP may be equal to or less than the width W3 of the first portion 410A. It is shown in FIGS. 4 and 5 that the width W2 of the second opening 430OP is less than the width W3 of the first portion 410A. The second insulating layer 430 may cover the entirety of the second portion 410B of the first insulating layer 410 and the trench 410T, and cover a portion (e.g., an outer portion) of the first portion 410A of the first insulating layer 410. The second insulating layer 430 may directly contact the lateral surface of the first portion 410A. In the case where the trench 410T has the shape of a through-hole, the second insulating layer 430 may directly contact the top surface of the encapsulation layer 300 through the trench 410T.

The lateral surface of the second insulating layer 430 that defines the second opening 430OP may include a forward-tapered slope. The slope of the lateral surface of the second insulating layer 430 may have a second angle θ2. The second angle θ2 may be in the range of about 30° to about 70° with respect to the top surface of the second sub-insulating layer 412.

The second insulating layer 430 may include a material that is different from that of the first insulating layer 410. As an example, the second insulating layer 430 may include an organic insulating material. The organic insulating material of the second insulating layer 430 may include an acryl-based resin, an epoxy-based resin, polyimide, and polyethylene. In an embodiment, the second insulating layer 430 may include (ethyl)hexyl acrylate, pentafluoropropyl acrylate, poly(ethylene glycol) dimethacrylate, or ethylene glycol dimethacrylate. In an embodiment, the second insulating layer 430 may further include a light-hardened material. The third insulating layer 450 may be arranged on the second insulating layer 430 and may have an approximately flat top surface. The third insulating layer 450 may fill at least a portion of the second opening 430OP. A portion of the third insulating layer 450 may directly contact the top surface of the first insulating layer 410 through the second opening 430OP. The material of the third insulating layer 450 may be different from the materials of the first and second insulating layers 410 and 430. The third insulating layer 450 may include an organic insulating material such as an acryl-based resin, an epoxy-based resin, polyimide, and polyethylene. In an embodiment, the third insulating layer 450 may include polydiarylsiloxane, methyltrimethoxysilane, or tetramethoxysilane. In an embodiment, the third insulating layer 450 may include an acryl-based and/or siloxane-based organic material. The third insulating layer 450 may include dispersed particles for making a high refractive index, for example, metal oxide such as zinc oxide ($ZnO_x$), titanium oxide ($TiO_2$), and zirconium oxide ($ZrO_2$) dispersed in the organic insulating material.

The refractive indexes of the first insulating layer 410, the second insulating layer 430, and the third insulating layer 450 may be different from one another. A first refractive index n1 of the first insulating layer 410 may be greater than each of a second refractive index n2 of the second insulating layer 430 and a third refractive index n3 of the third insulating layer 450. The second refractive index n2 of the second insulating layer 430 may be less than the third refractive index n3 of the third insulating layer 450.

The second refractive index n2 of the second insulating layer 430 may be equal to or greater than about 1.3 and less than about 1.6 (1.3≤n2<1.6). The third refractive index n3 of the third insulating layer 450 may be equal to or greater than about 1.6 and less than about 1.8 (1.6≤n3<1.8). The first refractive index n1 of the first insulating layer 410 may be equal to or greater than about 1.8 and less than about 2.0 (1.8≤n1<2.0). In an embodiment, the first refractive index n1 of the first insulating layer 410 may be about 1.8 to about 1.9. The second refractive index n2 of the second insulating layer 430 may be about 1.5. The third refractive index n3 of the third insulating layer 450 may be about 1.6 to about 1.7.

Due to a difference between the structures and/or between the refractive indexes of the first insulating layer 410 and the second insulating layer 430, as shown in FIG. 6, first light L1 emitted from the emission layer 222 progresses along a first path P11 in a direction oblique to a z-direction and is refracted at the lateral surface of the first portion 410A of the first insulating layer 410 and may progress along a second path P12, that is, in a direction (the z-direction) perpendicular to the top surface of the substrate 100. Accordingly, a light emission efficiency of the display apparatus 10, for example, a front light emission efficiency may be improved.

Similar to the structure of the first insulating layer 410, light may be refracted also at the lateral surface of the second insulating layer 430 that defines the second opening 430OP. As shown in FIG. 6, second light L2 emitted from the emission layer 222 may be refracted at the lateral surface of the second insulating layer 430 due to a difference between the refractive index of the second insulating layer 430 and the refractive index of the third insulating layer 450, and then may progress in a direction (the z-direction) perpendicular to the top surface of the substrate 100. Accordingly, a light emission efficiency of the display apparatus 10, for example, a front light emission efficiency may be improved.

As a comparative example, in the case where the first insulating layer 410 does not include the trench 410T (for example, in the case where the first insulating layer 410 covers the entirety of the substrate 100), the first light L1 described with reference to FIG. 6 is not refracted and progresses along the first path P11, which is the original progression path, rather than the second path P12 after passing the first insulating layer 410, and thus, the first light L1 is hard to arrive at the user's eyes located in the front of the display apparatus 10. In this case, to improve the front light emission efficiency, the thickness of the second insulating layer 430 needs to be increased. In the case where the thickness of the second insulating layer 430 is increased, the fluidity of the material of the second insulating layer 430 is reduced while the second insulating layer 430 is manufactured, and thus, the second insulating layer 430 may not be coated locally and the thickness of the display apparatus 10 is increased. Accordingly, the front light emission efficiency is substantially difficult to improve. In contrast, according to an embodiment of the invention, because the first insulating layer 410 has the above-described structure, the front light emission efficiency may be improved while the thickness increase of the display apparatus 10 is prevented.

Figure 7:
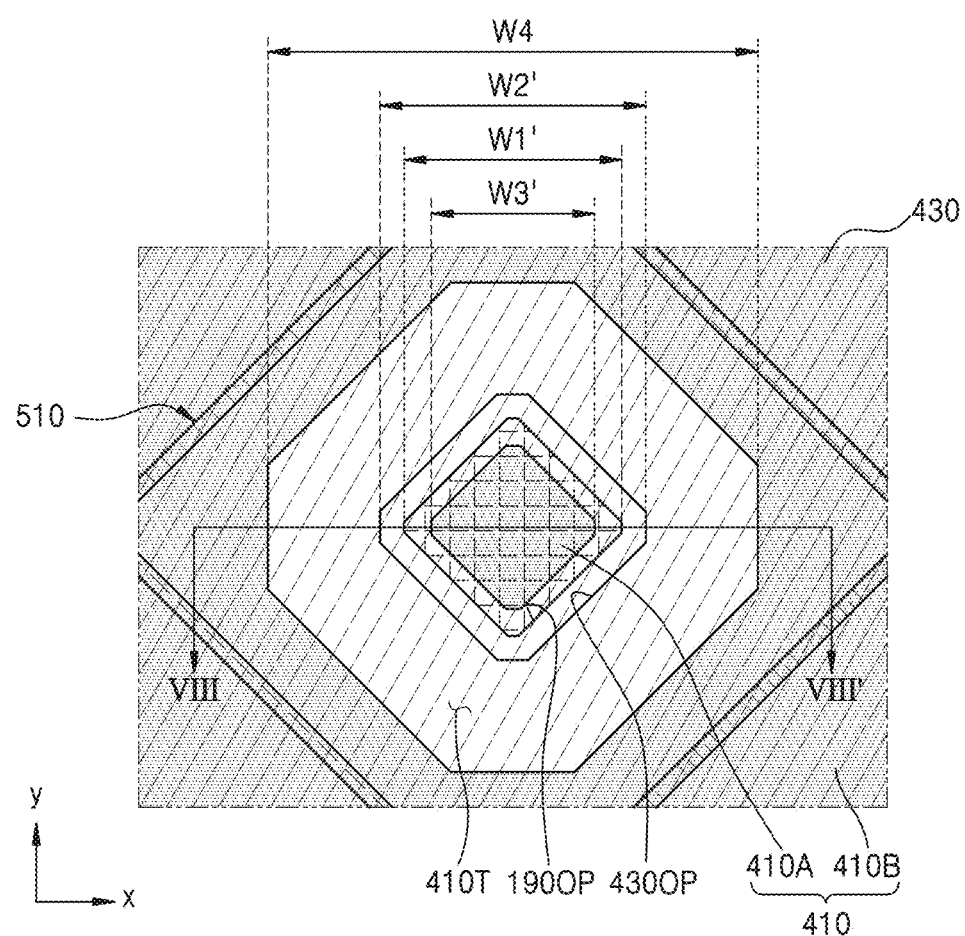
FIG. 7 is a plan view of a portion of a display apparatus according to another embodiment.
Figure 8:
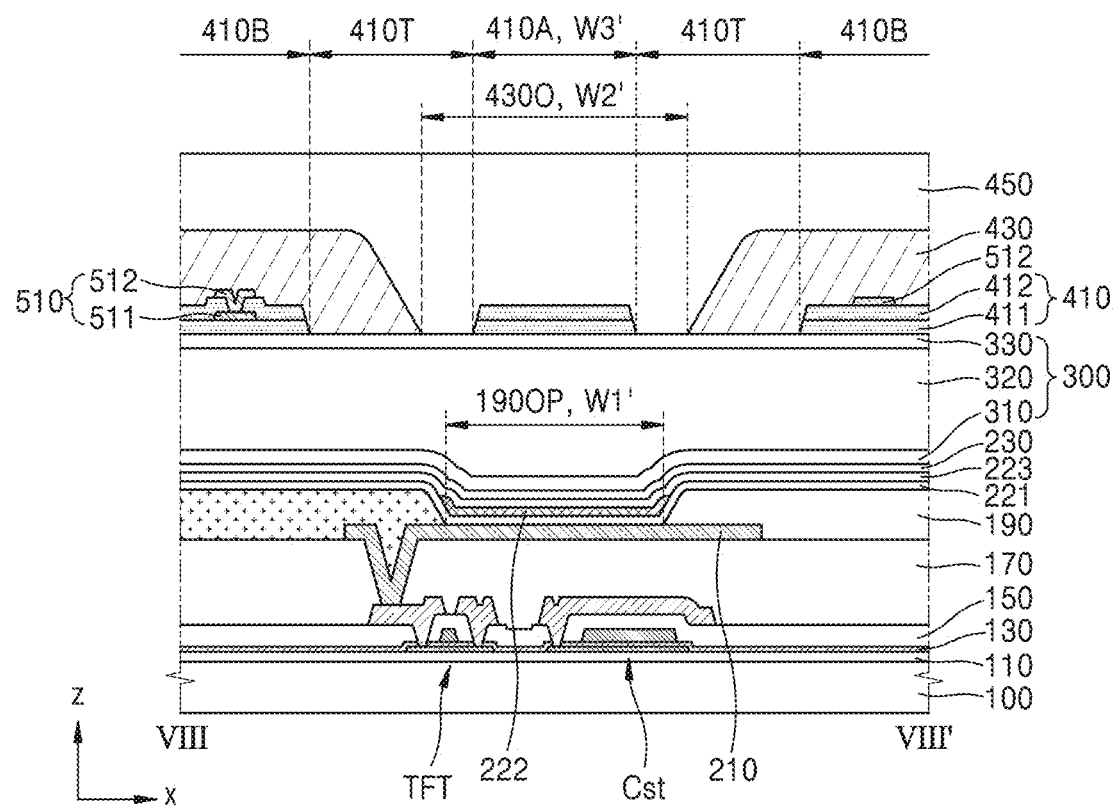
FIG. 8 is a cross-sectional view of the display apparatus taken along line VIII-VIII' of FIG. 7.
Figure 9:
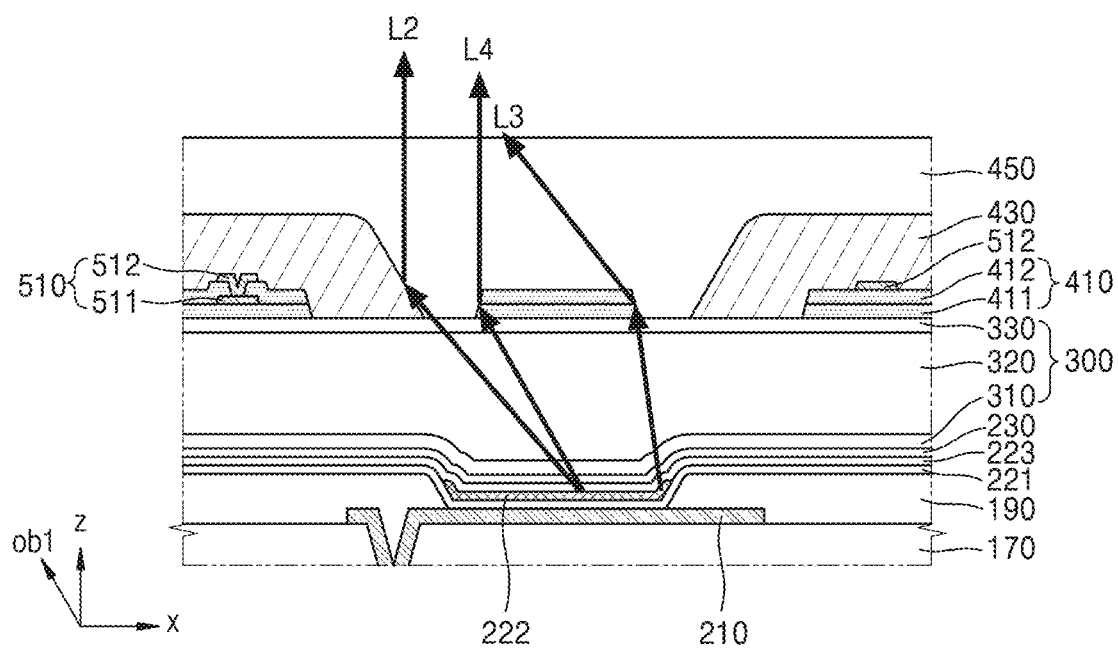
FIG. 9 is a view showing a progression path of light emitted from the display apparatus shown in FIG. 8.

FIG. 7 is a plan view of a portion of a display apparatus according to another embodiment, FIG. 8 is a cross-sectional view of the display apparatus taken along line VIII-VIII' of FIG. 7, and FIG. 9 is a view showing a progression path of light emitted from the display apparatus shown in FIG. 8.

In the display apparatus 10 shown in FIGS. 7 and 8, a width W1' of the first opening 190OP of the bank layer 190, a width W3' of the first portion 410A of the first insulating layer 410, and a width W2' of the second opening 430OP of the second insulating layer 430 in the x-direction are different from those of the display apparatus described with reference to FIGS. 4 and 5. Other characteristics except for the above differences are the same as those described above, and thus, the differences are mainly described below.

Like the embodiment described with reference to FIGS. 4 and 5, in the display apparatus of FIGS. 7 and 8, the first opening 190OP of the bank layer 190, the first portion 410A of the first insulating layer 410, and the second opening 430OP of the second insulating layer 430 may overlap one another in a plan view. The width W2' of the second opening 430OP of the second insulating layer 430 may be equal to or greater than the width W1' of the first opening 190OP. It is shown in FIGS. 7 and 8 that the width W2' of the second opening 430OP is greater than the width W1' of the first opening 190OP.

The width W3' of the first portion 410A of the first insulating layer 410 may be equal to or less than the width W1' of the first opening 190OP. In an embodiment, it is shown in FIGS. 7 and 8 that the width W3' of the first portion 410A is less than the width W1' of the first opening 190OP.

The width W3' of the first portion 410A may be less than the width W2' of the second opening 430OP. In this case, the second insulating layer 430 may cover a portion of the trench 410T. As an example, the outer portion of the trench 410T adjacent to the second portion 410B may be overlapped or covered by the second insulating layer 430. The inner portion of the trench 410T adjacent to the first portion 410A may be overlapped or covered by the third insulating layer 450. The inner portion of the trench 410T adjacent to the first portion 410A may overlap the second opening 430OP of the second insulating layer 430 in a plan view.

A portion of the second insulating layer 430 and a portion of the third insulating layer 450 may directly contact the top surface of the encapsulation layer 300 through the trench 410T. A portion of the second insulating layer 430 may directly contact the top surface of the encapsulation layer 300 through a portion (the outer portion) of the trench 410T. A portion of the third insulating layer 450 may directly contact the top surface of the encapsulation layer 300 through a portion (the inner portion) of the trench 410T. The lateral surface of the first portion 410A may directly contact the third insulating layer 450. The first to third refractive indexes of the first insulating layer 410, the second insulating layer 430, and the third insulating layer 450 are the same as those described above.

As shown in FIG. 9, due to the above-described structure, third light L3 emitted from the emission layer 222 may be refracted at one lateral surface of the first portion 410A and may progress in a direction ob1 oblique to the z-direction. The oblique direction ob1 may denote a direction intersecting with the top surface (an x-y plane) of the substrate 100 described with reference to FIG. 8 at an angle that is not a right angle. The third light L3 progressing in the oblique direction ob1 may improve a light emission efficiency of the display apparatus, for example, a lateral light emission efficiency. As the lateral light emission efficiency is improved, a viewing angle of the display apparatus widens.

Fourth light L4 emitted from the emission layer 222 may be refracted at another lateral surface of the first portion 410A and may progress in the z-direction. The fourth light L4 progressing in the z-direction may improve a light emission efficiency of the display apparatus, for example, a front light emission efficiency.

As described above with reference to FIG. 6, light may be refracted also at the lateral surface of the second insulating layer 430 that defines the second opening 430OP. The second light L2 emitted from the emission layer 222 may be refracted at the lateral surface of the second insulating layer 430 that defines the second opening 430OP and may progress in a direction (the z-direction) perpendicular to the top surface of the substrate 100. Accordingly, a light emission efficiency of the display apparatus, for example, a front light emission efficiency may be improved.

Figure 10:
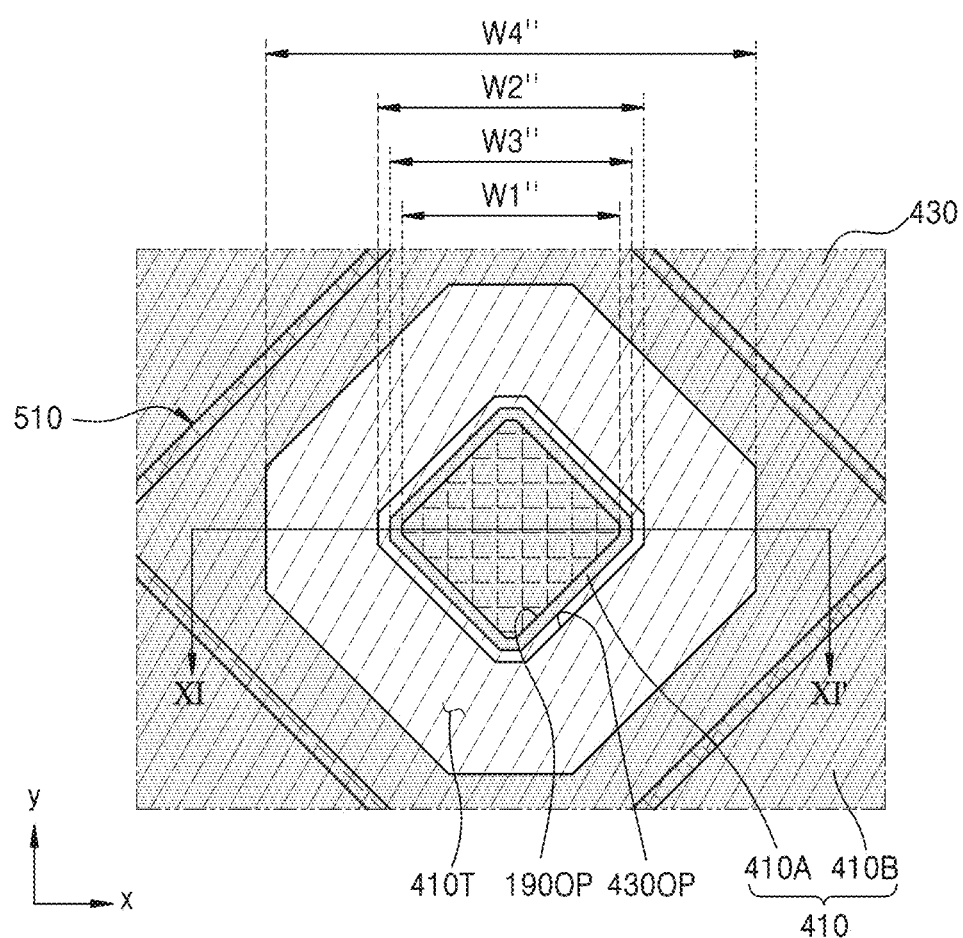
FIG. 10 is a plan view of a portion of a display apparatus according to still another embodiment.
Figure 11:
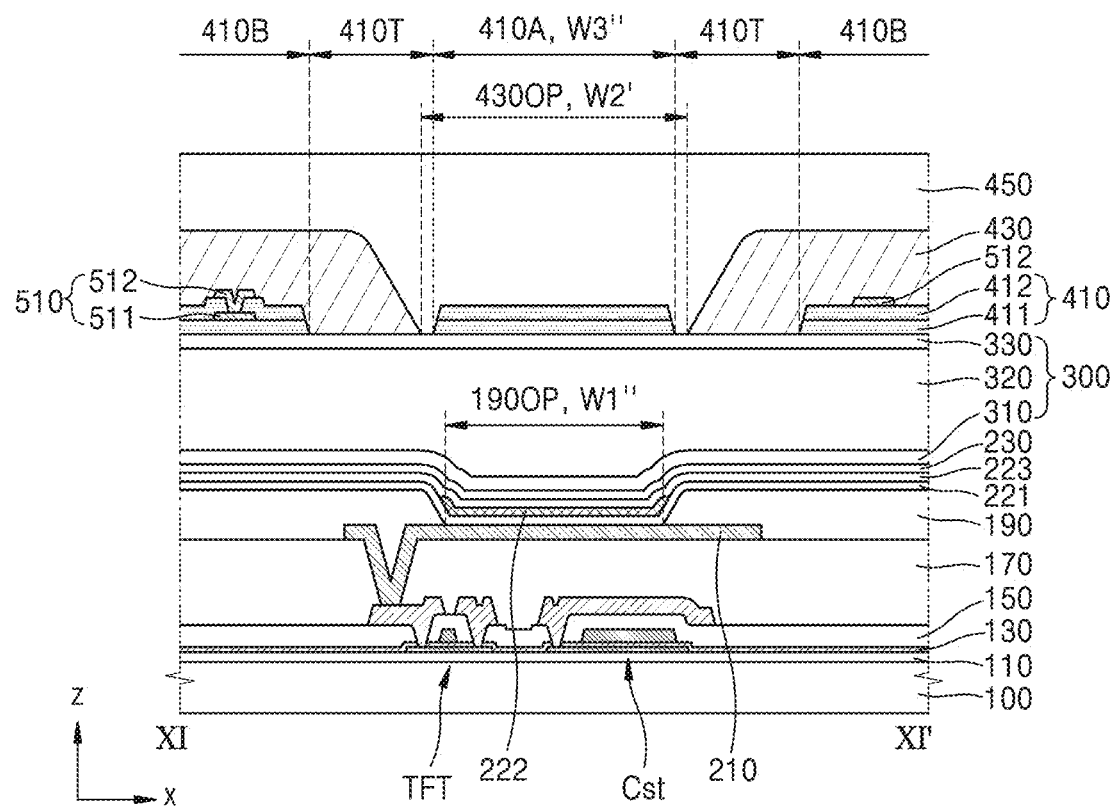
FIG. 11 is a cross-sectional view of the display apparatus taken along line XI-XI' of FIG. 10.

Though it is shown in FIGS. 7 and 8 that the width W3' of the first portion 410A is less than the width W1' of the first opening 190OP, the embodiment according to the invention is not limited thereto. As shown in FIGS. 10 and 11, the width W3' of the first portion 410A may be greater than a width W1" of the first opening 190OP FIG. 10 is a plan view of a portion of a display apparatus according to still another embodiment, and FIG. 11 is a cross-sectional view of the display apparatus taken along line XI-XI' of FIG. 10.

In a display apparatus shown in FIGS. 10 and 11, a width W1" of the first opening 190OP of the bank layer 190, a width W3" of the first portion 410A of the first insulating layer 410, and a width W2" of the second opening 430OP of the second insulating layer 430 are different from those of the display apparatus described with reference to FIGS. 4 and 5. Other characteristics except for the above differences are the same as those described above, and thus, the differences are mainly described below.

The first opening 190OP of the bank layer 190, the first portion 410A of the first insulating layer 410, and the second opening 430OP of the second insulating layer 430 may overlap one another in a plan view. The width W2" of the second opening 430OP of the second insulating layer 430 may be equal to or greater than the width W1" of the first opening 190OP. It is shown in FIGS. 10 and 11 that the width W2" of the second opening 430OP is greater than the width W1" of the first opening 190OP.

The width W3" of the first portion 410A of the first insulating layer 410 may be equal to or greater than the width W1" of the first opening 190OP. In an embodiment, it is shown in FIGS. 10 and 11 that the width W3" of the first portion 410A is greater than the width W1" of the first opening 190OP.

The width W3" of the first portion 410A may be less than the width W2" of the second opening 430OP. In this case, as described with reference to FIGS. 7 and 8, the second insulating layer 430 may cover a portion of the trench 410T. As an example, the outer portion of the trench 410T that is adjacent to the second portion 410B may be overlapped or covered by the second insulating layer 430. The inner portion of the trench 410T that is adjacent to the first portion 410A may be overlapped or covered by the third insulating layer 450. A portion of the second insulating layer 430 and a portion of the third insulating layer 450 may directly contact the top surface of the encapsulation layer 300 through the trench 410T as described above with reference to FIG. 8.

Light emitted from the emission layer 222 of the display apparatus having the structure shown in FIGS. 10 and 11 may progress along a progression path described above with reference to FIG. 9, and thus, a light emission efficiency of the display apparatus, for example, a front light emission efficiency and/or a lateral light emission efficiency may be improved.

Figure 12:
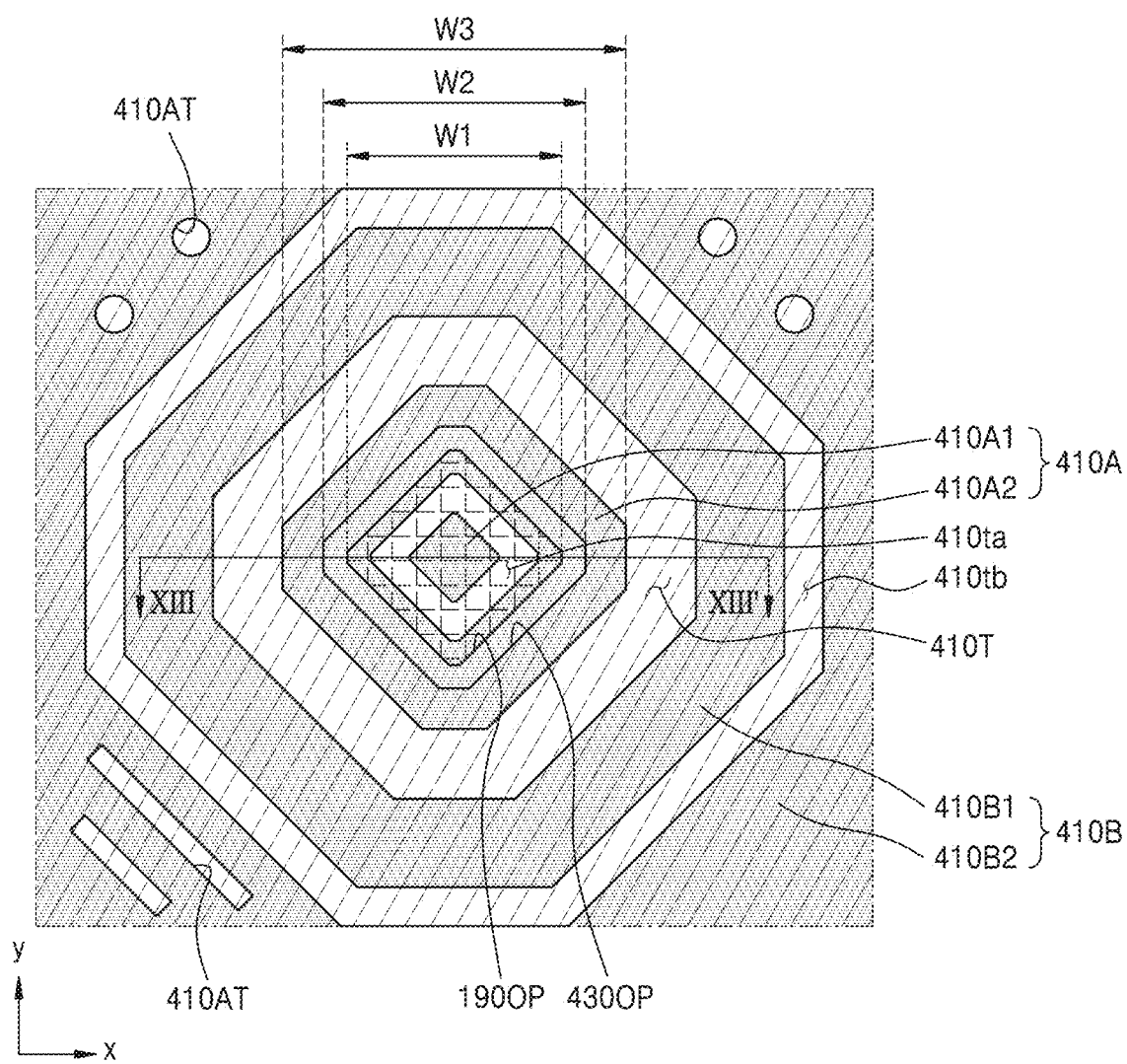
FIG. 12 is a plan view of a portion of a display apparatus according to yet another embodiment.
Figure 13:
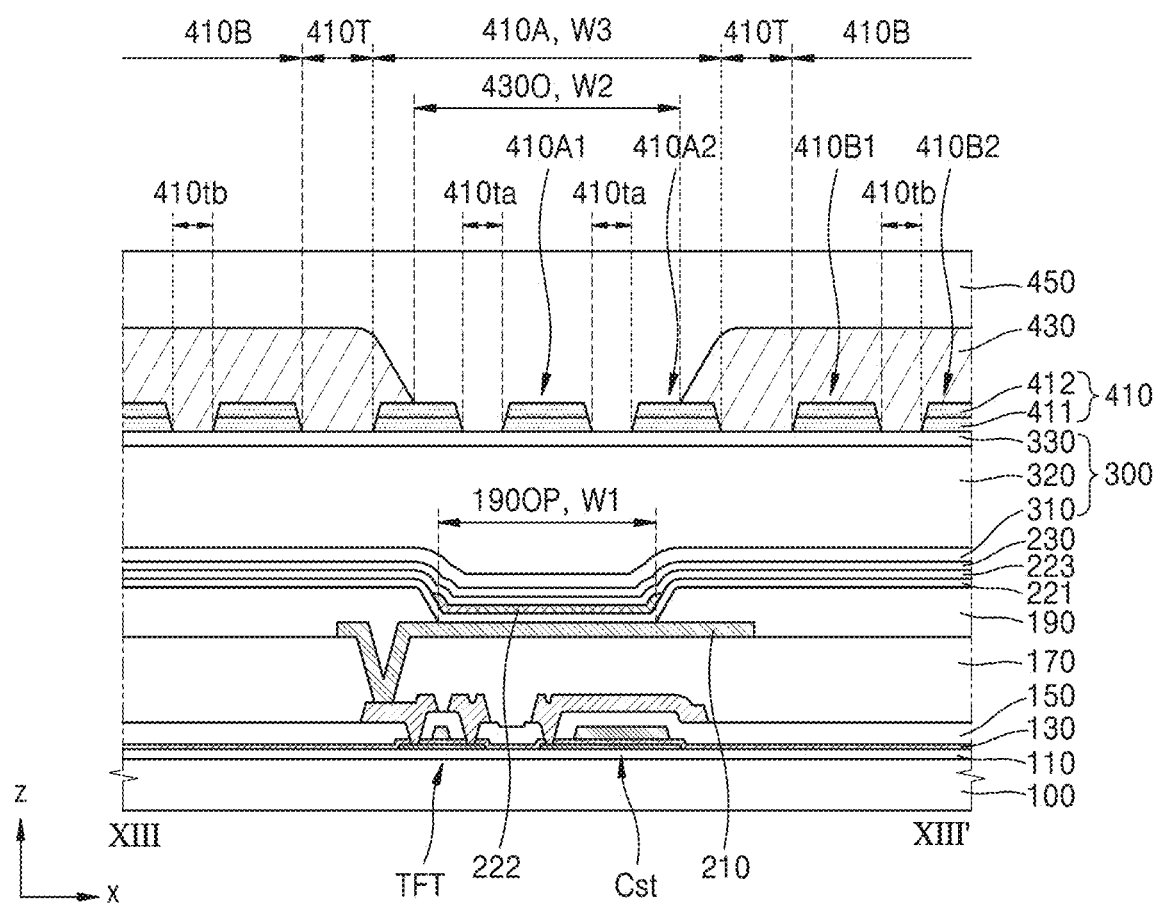
FIG. 13 is a cross-sectional view of the display apparatus taken along line XIII-XIII' of FIG. 12.
Figure 14:
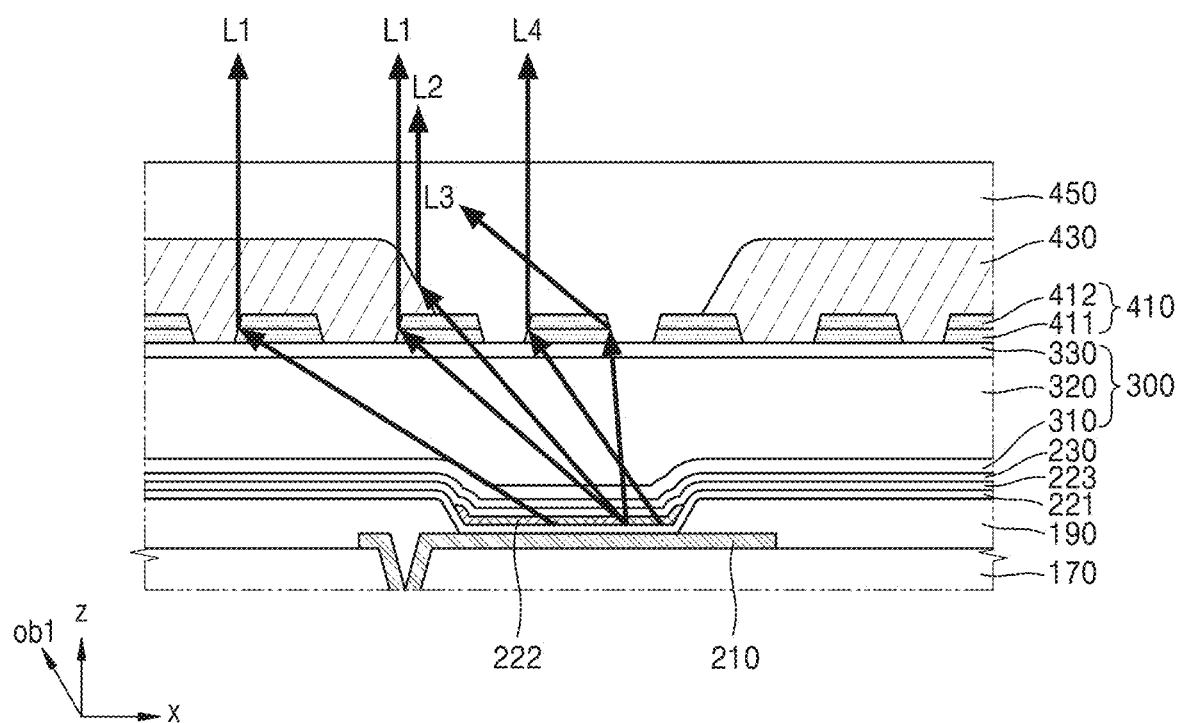
FIG. 14 is a view showing a progression path of light emitted from the display apparatus shown in FIG. 12.

FIG. 12 is a plan view of a portion of a display apparatus according to yet another embodiment, FIG. 13 is a cross-sectional view of the display apparatus taken along line XIII-XIII' of FIG. 12, and FIG. 14 is a view showing a progression path of light emitted from the display apparatus shown in FIG. 12. For convenience, though FIGS. 12 and 13 omit the touch electrode 510 (see FIG. 5), the structure of the touch electrode 510 in this embodiment is the same as that described above with reference to FIG. 5.

The display apparatus shown in FIGS. 12 and 13 includes the first insulating layer 410 including the first portion 410A and the second portion 410B. The first portion 410A is arranged inside the trench 410T, and the second portion 410B is arranged outside the trench 410T. It is shown in FIGS. 12 and 13 that the first portion 410A includes a plurality of sub-portions separated by a first trench 410ta.

In an embodiment, the first portion 410A of the first insulating layer 410 may include first and second sub-portions 410A1 and 410A2 separated by the first trench 410ta. The first trench 410ta may be surrounded by the trench 410T and may have a closed-loop shape in a plan view as shown in FIG. 12.

The first sub-portion 410A1 may be surrounded by the first trench 410ta and may have an isolated shape. The second sub-portion 410A2 may be apart from the first sub-portion 410A1 with the first trench 410ta therebetween and may have a closed-loop shape in a plan view as shown in FIG. 12.

The second sub-portion 410A2 may surround the first trench 410ta and have an isolated shape. The second sub-portion 410A2 may be surrounded by the trench 410T. The second sub-portion 410A2 may have a frame structure having a closed-loop shape in a plan view as shown in FIG. 12.

Thought it is shown in FIGS. 12 and 13 that the first portion 410A defines one first trench 410ta and includes two sub-portions, the embodiment according to the invention is not limited thereto. In another embodiment, the first portion 410A may be divided by N first trenches (N is a natural number equal to or greater than 2) and may include (N+1) sub-portions.

The second opening 430OP of the second insulating layer 430 may overlap the first portion 410A in a plan view. As an example, at least one of the sub-portions of the first portion 410A may directly contact the third insulating layer 450 through the second opening 430OP while overlapping the second opening 430OP. At least another sub-portion of the first portion 410A may overlap the second insulating layer 430. With regard to this, it is shown in FIG. 13 that the first sub-portion 410A1 may directly contact the third insulating layer 450 through the second opening 430OP, and the second sub-portion 410A2 directly contacts the second insulating layer 430 and the third insulating layer 450.

Two opposite side surfaces of the first sub-portion 410A1 may directly contact the third insulating layer 450. One of the two opposite side surfaces of the second sub-portion 410A2 may directly contact the third insulating layer 450, and the other of the two opposite side surfaces of the second sub-portion 410A2 may directly contact the second insulating layer 430 while being covered by the second insulating layer 430. The lateral surfaces of the first sub-portion 410A1 and the second sub-portion 410A2 may include the forward-tapered slope having the first angle as described with reference to FIG. 5.

As described The first portion 410A may overlap the emission layer EA (see FIG. 4) and/or the first opening 190OP of the bank layer 190 in a plan view. The width W3 of the first portion 410A may be greater than the width W1 of the first opening 190OP. A width W2 of the second opening 430OP may be equal to or greater than the width W1 of the first opening 190OP. It is shown in FIGS. 12 and 13 that the width W2 of the second opening 430OP is greater than the width W1 of the first opening 190OP. The width W2 of the second opening 430OP may be equal to or less than the width W3 of the first portion 410A. It is shown in FIGS. 12 and 13 that the width W2 of the second opening 430OP is less than the width W3 of the first portion 410A.

Referring to FIGS. 13 and 14, the third light L3 and the fourth light L4 emitted from the emission layer 222 may each be refracted at the lateral surface of the first sub-portion 410A1 and may progress in the direction ob1 that is oblique to the z-direction or progress in the z-direction. The first light L1 emitted from the emission layer 222 may be refracted at one lateral surface (i.e., a lateral surface covered by the second insulating layer 430) of the second sub-portion 410A2 to progress in the z-direction. Accordingly, a light emission efficiency of the display apparatus, for example, a lateral light emission efficiency and a front light emission efficiency may be improved.

Similar to the first portion 410A, the second portion 410B of the first insulating layer 410 may include a plurality of sub-portions. As shown in FIGS. 12 and 13, the second portion 410B may include third and fourth sub-portions 410B1 and 410B2 separated by a second trench 410tb. The second trench 410tb may be arranged outside the trench 410T and may have a closed-loop shape in a plan view as shown in FIG. 12.

The third sub-portion 410B1 may be surrounded by the second trench 410tb and may have a frame shape. The third sub-portion 410B1 may be apart from the fourth sub-portion 410B2 with the second trench 410tb therebetween and may have a closed-loop shape in a plan view as shown in FIG. 12. The fourth sub-portion 410B2 may surround the second trench 410tb. The trench 410T may be referred as a main trench, and the first trench 410ta and the second trench 410tb may be referred as sub-trenches. The fourth sub-portion 410B2 may include auxiliary trenches 410AT as shown in FIG. 12. The auxiliary trenches 410AT may be apart from each other in a plan view and be a circular or a bar type. In another embodiment, the auxiliary trenches 410AT may have various shapes such as elliptical shapes or polygonal shapes.

Sub-portions of the second portion 410B may overlap the second insulating layer 430 in a plan view. As an example, sub-portions of the second portion 410B may directly contact the second insulating layer 430. With regard to this, it is shown in FIG. 13 that the third and fourth sub-portions 410B1 and 410B2 directly contact the second insulating layer 430. The lateral surfaces of the third and fourth sub-portions 410B1 and 410B2 may have a forward-tapered slope having the first angle and be covered by the second insulating layer 430 while contacting the second insulating layer 430.

Though it is shown in FIGS. 12 and 13 that the second portion 410B defines one second trench 410tb and includes two sub-portions, the embodiment according to the invention is not limited thereto. In another embodiment, the second portion 410B may be divided by M second trenches (M is a natural number equal to or greater than 2), and thus, may include (M+1) sub-portions.

Referring to FIG. 14, the first light L1 emitted from the emission layer 222 may be refracted at the lateral surface of the third sub-portion 410B1 to progress in the z-direction. Accordingly, a light emission efficiency of the display apparatus, for example, a front light emission efficiency may be improved.

The lateral surface of the second insulating layer 430 that defines the second opening 430OP may include a forward-tapered slope and directly contact the third insulating layer 450. As shown in FIG. 14, the second light L2 emitted from the emission layer 222 may be refracted at the lateral surface of the second insulating layer 430 to progress in the z-direction.

The width W3 of the first portion 410A of the first insulating layer 410 may be equal to or greater than the width W2 of the second opening 430OP of the second insulating layer 430. It is shown in FIGS. 12 to 14 that the width W3 of the first portion 410A of the first insulating layer 410 is greater than the width W2 of the second opening 430OP of the second insulating layer 430 in the x-direction. However, the embodiment according to the invention is not limited thereto.

In another embodiment, the width of the first portion 410A of the first insulating layer 410 may be less than the width of the first opening 190OP of the bank layer 190 and/or the width of the second opening 430OP of the second insulating layer 430. In another embodiment, the width of the first portion 410A of the first insulating layer 410 may be greater than the width of the first opening 190OP of the bank layer 190 and less than the width of the second opening 430OP of the second insulating layer 430.

Figure 15:
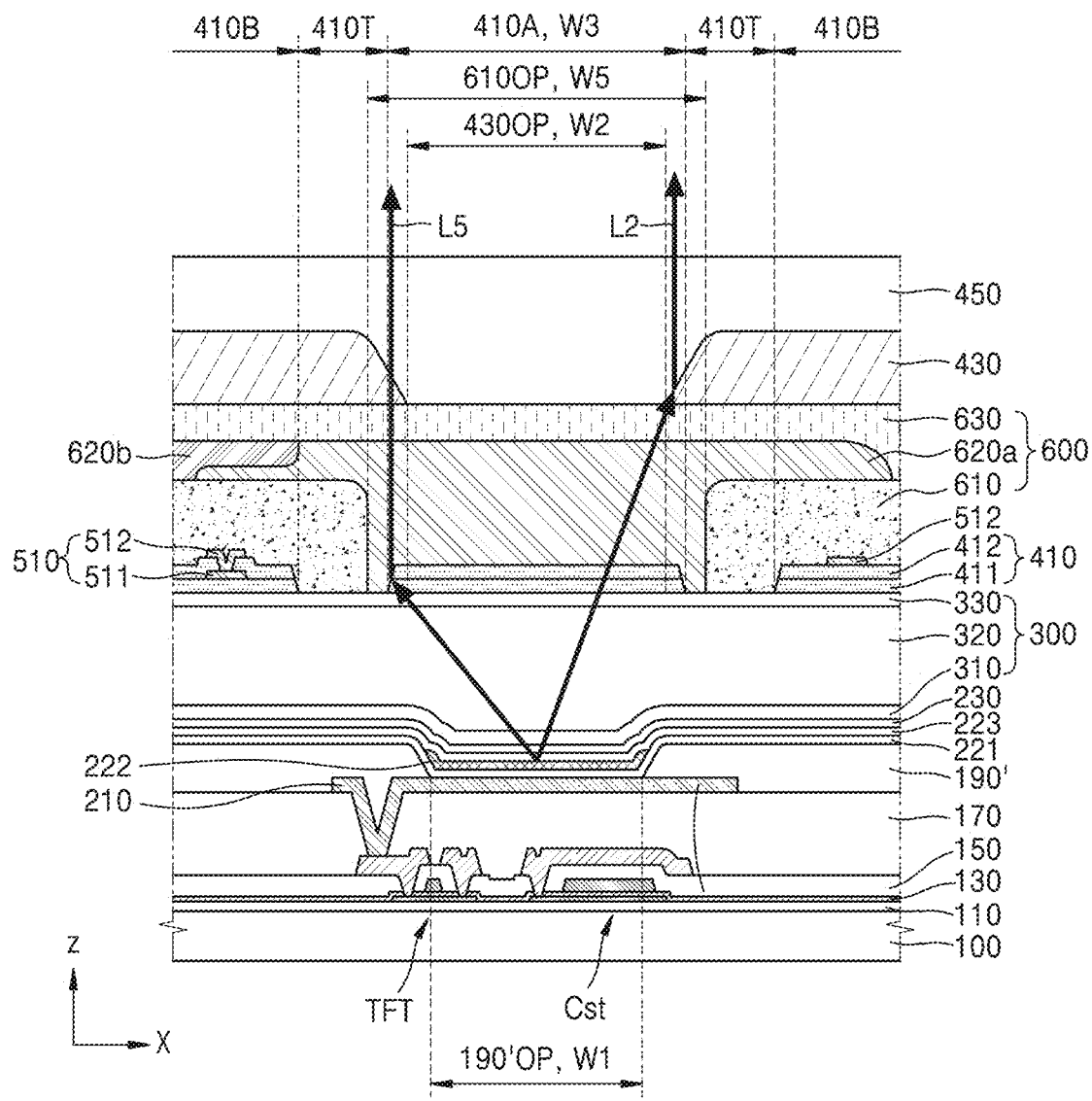
FIG. 15 is a cross-sectional view of a portion of a display apparatus according to another embodiment.
Figure 16:
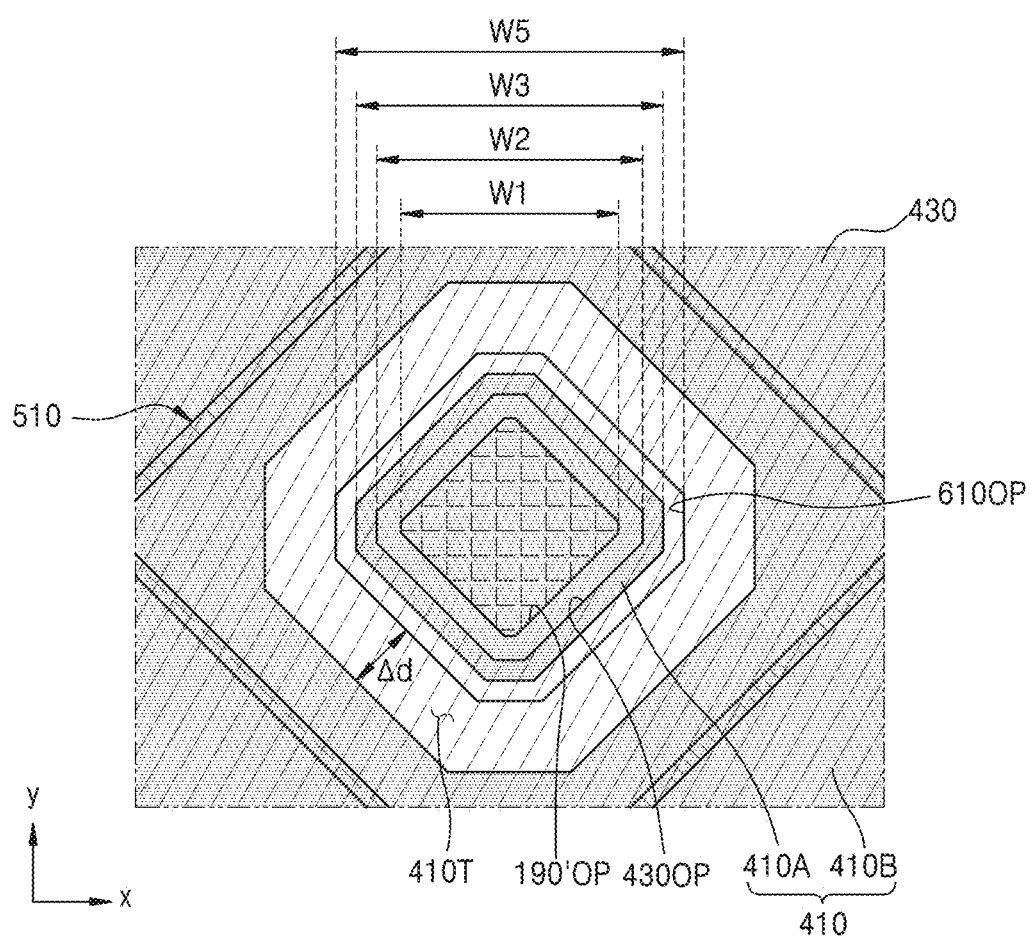
FIG. 16 is a plan view of FIG. 15.

FIG. 15 is a cross-sectional view of a portion of a display apparatus according to another embodiment, and FIG. 16 is a plan view of FIG. 15.

The display apparatus shown in FIG. 15 may further include a filter layer 600 between the first insulating layer 410 and the second insulating layer 430, and the other characteristics except for the above characteristics are the same as those described above with reference to FIGS. 4 and 5.

The filter layer 600 may include a light-blocking portion 610, color filters, and an overcoat layer 630. The light-blocking portion 610 defines an opening 610OP, the color filters are arranged in the opening 610OP of the light-blocking portion 610, and the overcoat layer 630 is on the light-blocking portion 610 and the color filters.

The opening 610OP of the light-blocking portion 610 may overlap a first opening 190'OP of a bank layer 190'. The light-blocking portion 610 may include a black matrix.

The color filters may be arranged in the opening 610OP of the light-blocking portion 610. With regard to this, FIG. 15 shows a first color filter 620a arranged in the opening 610OP. The first color filter 620a may overlap a second color filter 620b having a different color on the light-blocking portion 610. Though FIG. 15 shows two color filters, the filter layer 600 may include three color filters having different colors, for example, red, green, and blue colors. The positions of the three color filters may be determined depending on the color of light emitted from the light-emitting diode. As an example, in the case where the emission layer 222 shown in FIG. 15 emits red light, the first color filter 620a may be a red color filter. In another embodiment, in the case where the emission layer 222 shown in FIG. 15 emits green or blue light, the first color filter 620a may be a green or blue color filter.

The overcoat layer 630 is a light-transmissive layer and may planarize the top surface of the light-blocking portion 610 and the top surface of the color filters. The overcoat layer 630 may include an organic insulating material such as an acryl-based resin.

Through the above structure, the filter layer 600 may prevent reflection of light progressing to the display apparatus from the outside. In an embodiment, the bank layer 190' may include a light-blocking material. The bank layer 190' including a light-blocking material and the filter layer 600 may even more improve an anti-reflection function of external light.

The first insulating layer 410 may have the structure described above with reference to FIG. 5. As an example, the first insulating layer 410 may include the first portion 410A and the second portion 410B apart from each other in the trench 410T. The material and the first refractive index of the first insulating layer 410 are the same as those described above.

As shown in FIGS. 15 and 16, the width W3 of the first portion 410A of the first insulating layer 410 may be less than a width W5 of the opening 610OP of the light-blocking portion 610 in the x-direction. The lateral surface of the first portion 410A, for example, the lateral surface of the forward-tapered lateral surface may overlap one of the color filters. The lateral surface of the first portion 410A may directly contact the first color filter 620a as shown in FIG. 15. The color filters may have a refractive index less than the first refractive index of the first insulating layer 410. As an example, the color filters may have a refractive index of about 1.5.

Light emitted from the emission layer 222, for example, the fifth light L5 may be bent due to a difference in a refractive index between the first portion 410A and the first color filter 620a and then may progress in the z-direction as shown in FIG. 15. In addition, as described above with reference to FIG. 5, light emitted from the emission layer 222, for example, the second light L2 may be bent at the lateral surface of the second insulating layer 430 that defines the second opening 430OP to progress in the z-direction.

The width W3 of the first portion 410A may be equal to or greater than the width W1 of the first opening 190'OP and be equal to or greater than the width W2 of the second opening 430OP. In an embodiment, though it is shown in FIG. 15 that the width W3 of the first portion 410A is greater than each of the width W1 of the first opening 190'OP and the width W2 of the second opening 430OP, the embodiment according to the invention is not limited thereto. In another embodiment, the width of the first portion 410A of the first insulating layer 410 may be less than each of the width of the first opening 190'OP of the bank layer 190' and the width of the second opening 430OP of the second insulating layer 430. In another embodiment, the width of the first portion 410A of the first insulating layer 410 may be greater than the width of the bank layer 190' and less than the width of the second opening 430OP of the second insulating layer 430.

The second opening 430OP of the second insulating layer 430 may overlap the first opening 190'0P, the first portion 410A, and the opening 610OP of the light-blocking portion 610 in a plan view. The width W2 of the second opening 430OP of the second insulating layer 430 may be equal to or less than the width W5 of the opening 610OP of the light-blocking portion 610. In another embodiment, the width W2 of the second opening 430OP of the second insulating layer 430 may be greater than the width W5 of the opening 610OP of the light-blocking portion 610 in the x-direction. The lateral surface of the second insulating layer 430 that defines the second opening 430OP may directly contact the third insulating layer 450, and the second light L2 emitted from the emission layer 222 may be refracted at the lateral surface of the second insulating layer 430 to progress in the z-direction.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a first electrode;
a bank layer defining a first opening which overlaps the first electrode in a plan view;
an emission layer which overlaps the first electrode through the first opening;
a second electrode on the emission layer;
an encapsulation layer on the second electrode;
a first insulating layer on the encapsulation layer, wherein the first insulating layer includes a first portion overlapping the first opening and defines a main trench surrounding the first portion;
a touch electrode on the first insulating layer;
a second insulating layer on the touch electrode and defining a second opening which overlaps the first opening; and
a third insulating layer on the second insulating layer.

2. The display apparatus of claim 1, wherein the first insulating layer includes a multi-layered structure including a first sub-insulating layer and a second sub-insulating layer,
the touch electrode includes a metal line surrounding at least a portion of the first opening in the plan view, and
the metal line is disposed on at least one of the first sub-insulating layer or the second sub-insulating layer.

3. The display apparatus of claim 1, wherein the first insulating layer includes an inorganic insulating material.

4. The display apparatus of claim 1, wherein an edge of the second insulating layer that defines the second opening is arranged on the first portion.

5. The display apparatus of claim 1, wherein an edge of the second insulating layer that defines the second opening is arranged in the main trench.

6. The display apparatus of claim 1, wherein the first portion of the first insulating layer includes a first sub-portion and a second sub-portion which are apart from each other with respect to a sub-trench surrounded by the main trench.

7. The display apparatus of claim 1, further comprising a filter layer arranged between the first insulating layer and the second insulating layer and including a light-blocking portion and a color filter.

8. The display apparatus of claim 1, wherein a first refractive index of the first insulating layer is greater than each of a second refractive index of the second insulating layer and a third refractive index of the third insulating layer.

9. The display apparatus of claim 8, wherein the third refractive index of the third insulating layer is greater than the second refractive index of the second insulating layer.

10. The display apparatus of claim 1, wherein a lateral surface of the first portion includes a forward-tapered slope.

11. The display apparatus of claim 10, wherein the slope of the lateral surface of the first portion is about 40 degrees (°) to about 80°.

12. The display apparatus of claim 1, wherein a width of the second opening of the second insulating layer is equal to or greater than a width of the first opening of the bank layer.

13. The display apparatus of claim 12, wherein a width of the first portion of the first insulating layer is equal to or greater than the width of the first opening.

14. The display apparatus of claim 12, wherein a width of the first portion of the first insulating layer is equal to or less than the width of the first opening.

\* \* \* \* \*